US011150306B2

(12) United States Patent
Akaishi (10) Patent No.: US 11,150,306 B2
(45) Date of Patent: Oct. 19, 2021

(54) STATE OF CHARGE ESTIMATION DEVICE

(71) Applicant: TOYOTA JIDOSHA KABUSHIKI KAISHA, Toyota (JP)

(72) Inventor: Takayuki Akaishi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 57 days.

(21) Appl. No.: 16/824,757

(22) Filed: Mar. 20, 2020

(65) Prior Publication Data

US 2020/0355748 A1 Nov. 12, 2020

(30) Foreign Application Priority Data

May 8, 2019 (JP) .............................. JP2019-088470

(51) Int. Cl.
*G01R 31/3842* (2019.01)
*G01R 31/367* (2019.01)
*G01R 31/3835* (2019.01)
*G01R 31/388* (2019.01)
*B60L 58/12* (2019.01)

(52) U.S. Cl.
CPC .......... *G01R 31/3842* (2019.01); *B60L 58/12* (2019.02); *G01R 31/367* (2019.01)

(58) Field of Classification Search
CPC .............. G01R 31/3842; G01R 31/367; G01R 31/3835; G01R 1/388; B60L 58/12
See application file for complete search history.

(56) References Cited

U.S. PATENT DOCUMENTS

| 2013/0154544 | A1* | 6/2013 | Yokoyama | ......... | G01R 31/3842 |
| | | | | | 320/105 |
| 2017/0254856 | A1 | 9/2017 | Shiraishi | | |
| 2021/0184278 | A1* | 6/2021 | Kataoka | ............... | G01R 31/396 |

FOREIGN PATENT DOCUMENTS

JP 2017-156187 A 9/2017

* cited by examiner

*Primary Examiner* — Vuthe Siek
(74) *Attorney, Agent, or Firm* — Oliff PLC (57) ABSTRACT

A state of charge estimation device includes a memory section, a measurement section, a time measurement section, and an estimation section. The memory section memorizes a specified dark current, which flows at an auxiliary battery while the vehicle is parked, and a first state of charge at a most recent time the vehicle was parked before being started. The measurement section measures an open circuit voltage. The time measurement section measures an elapsed time from the time the vehicle was parked to the time it is started. The estimation section updates the specified dark current memorized in the memory section such that a second state of charge approaches a third state of charge. If the open circuit voltage is in a first region, the estimation section estimates a state of charge on the basis of the first state of charge, the specified dark current, and an elapsed time.

6 Claims, 8 Drawing Sheets

STATE OF CHARGE ESTIMATION DEVICE

CROSS-REFERENCE TO RELATED APPLICATION

This application is based on and claims priority under 35 USC 119 from Japanese Patent Application No. 2019-088470 filed on May 8, 2019, the disclosure of which is incorporated by reference herein.

TECHNICAL FIELD

The present disclosure relates to a state of charge estimation device.

RELATED ART

Japanese Patent Application Laid-Open (JP-A) No. 2017-156187 (Patent Document 1) discloses a monitoring device for a power storage component that is equipped with a memory unit and an arithmetic processing unit. The monitoring device for a power storage component according to Patent Document 1 measures charging/discharging currents of a rechargeable battery and integrates the charging/discharging currents with a current state of charge (SoC) to estimate an SoC at a subsequent time.

In an SoC estimation method according to Patent Document 1, charging/discharging currents of a vehicle-mounted battery are measured using a current sensor. However, electricity is consumed by a measurement unit when measuring the charging/discharging currents, causing an error corresponding to the amount of this electricity consumption. In addition, there are measurement errors at the current sensor itself, and these measurement errors are included in the charging/discharging currents. For these reasons, with an SoC estimation method such as the method described in Patent Document 1, it is difficult to raise an accuracy of estimation of the state of charge of a vehicle-mounted battery when the vehicle is started after a period of parking. Thus, there is scope for improvement of the SoC estimation method.

SUMMARY

In consideration of the circumstances described above, an object of the present disclosure is to provide a state of charge estimation device that may raise an accuracy of estimation of the state of charge of a vehicle-mounted battery when the vehicle is started after a period of parking.

A state of charge estimation device according to a first aspect of the present disclosure is a state of charge estimation device for estimating a state of charge of a vehicle-mounted battery when the vehicle is started, a correlation characteristic between state of charge and open circuit voltage of the vehicle-mounted battery including a first region in which a rate of change of the open circuit voltage with respect to the state of charge is constant and a second region in which the rate of change is greater than in the first region, and the state of charge estimation device including: a memory section that memorizes a specified dark current, which is specified as a current that flows at the vehicle-mounted battery while the vehicle is parked, and a first state of charge at a most recent time the vehicle is parked before the vehicle is started; a measurement section that measures the open circuit voltage; a time measurement section that measures an elapsed time from when the vehicle is parked to when the vehicle is started; and an estimation section that, when the open circuit voltage measured by the measurement section when the vehicle is started has a value in the second region, updates the specified dark current memorized at the memory section such that a second state of charge obtained on the basis of the first state of charge, the specified dark current and the elapsed time approaches a third state of charge obtained on the basis of the correlation characteristic and the open circuit voltage, and when the open circuit voltage measured by the measurement section when the vehicle is started on a subsequent occasion has a value in the first region, estimates a state of charge of the vehicle-mounted battery on the basis of the first state of charge, the specified dark current and the elapsed time.

The correlation characteristic between state of charge and open circuit voltage of the vehicle-mounted battery whose state of charge is estimated by the state of charge estimation device according to the first aspect features the first region and the second region. The rate of change of the open circuit voltage with respect to the charging rate is constant in the first region, and is greater in the second region than in the first region. When the vehicle is started, if the open circuit voltage has a value in the second region, the estimation unit updates the specified dark current stored in the storage unit so as to bring the second state of charge closer to the third state of charge. That is, the specified dark current is corrected on the basis of the correlation characteristic in the second region, in which a state of charge may be uniquely determined from an open circuit voltage.

Hence, when the vehicle is started on a subsequent occasion, if the open circuit voltage has a value in the first region in which the rate of change is constant, the estimation section estimates a state of charge of the vehicle-mounted battery on the basis of a first state of charge, the updated specified dark current, and an elapsed time. Thus, the specified dark current is corrected on the basis of the second region of the correlation characteristic, and when the open circuit voltage has a value in the first region, the state of charge of the vehicle-mounted battery is estimated using the corrected specified dark current. Therefore, electricity may not be consumed in measurements of discharging currents and current measurement errors may not be introduced. As a result, the accuracy of estimation of the state of charge of the vehicle-mounted battery when the vehicle is started after a period of parking may be raised.

In a state of charge estimation device according to a second aspect of the present disclosure, the estimation section employs a correction term $\Delta d^2 \times k$ for correcting the specified dark current, $\Delta d$ representing a correction variable that is obtained on the basis of a difference between the third state of charge and the second state of charge, and k representing a constant.

In the state of charge estimation device according to the second aspect, although a correction amount per correction cycle is smaller than in a situation in which the specified dark current is corrected at one time using only a correction variable $\Delta d$, variations in correction amounts when correction is applied over plural cycles may be kept small. That is, because the specified dark current is progressively corrected when correction is applied over plural cycles, variations in the estimated states of charge may be suppressed.

According to the present disclosure, a state of charge estimation device may be provided that may raise an accuracy of estimation of the state of charge of a vehicle-mounted battery when the vehicle is started after a period of parking.

DETAILED DESCRIPTION

=Overall Structure=

Figure 1:
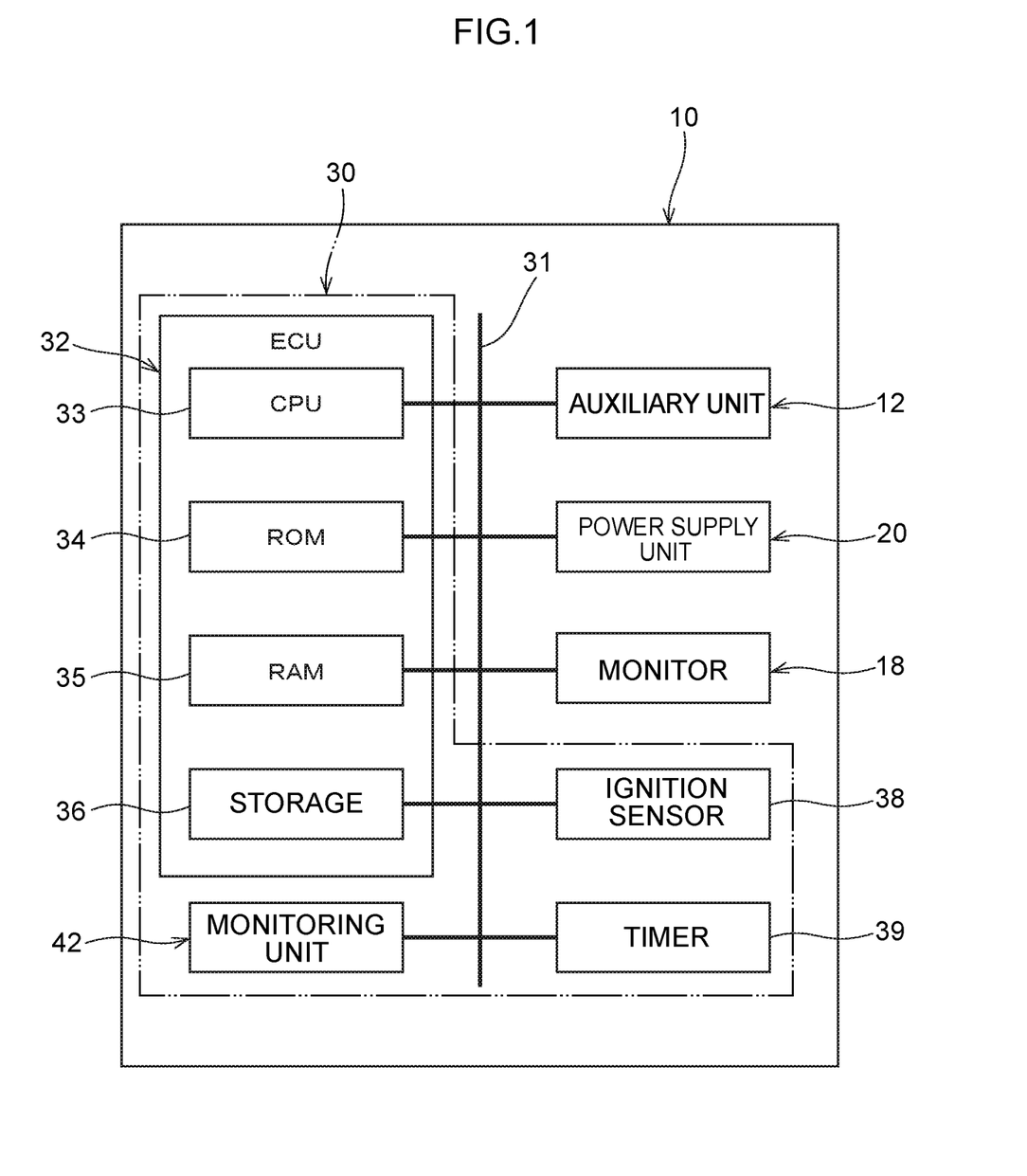
FIG. 1 is a block diagram showing principal structures of a vehicle in which a state of charge estimation device according to a present exemplary embodiment is employed.

FIG. 1 shows a block diagram of partial structure of a vehicle 10 in which a state of charge estimation device 30 according to a present exemplary embodiment is employed. The vehicle 10 includes an auxiliary unit 12, a monitor 18, a power supply unit 20 and the state of charge estimation device 30. The power supply unit 20 may be charged with electricity from a charging station, which is not shown in the drawings.

In the descriptions below, the meaning of the term "ECU" is intended to include an electronic control unit, and the meaning of the term "DDC" is intended to include a DC/DC converter, which converts a direct current to a direct current with a different magnitude. The meaning of the term "CPU" is intended to include a central processing unit, the meaning of the term "ROM" is intended to include read-only memory, the meaning of the term "RAM" is intended to include random access memory, and the meaning of the term "ACT" is intended to include actuators.

The meaning of the term "SoC" is intended to include a charge level (state of charge) of an auxiliary battery 24 (see FIG. 2), which is described below. The SoC is calculated using the following expression (1), in which Qa (unit: Ah (Ampere-hours)) represents a charged charge amount at a time of measurement and a fully charged charge amount Qf (unit: Ah) represents a maximum charged charge amount. The unit of SoC (state of charge) is %. A discharged charge amount ΔQ (unit: Ah) is a consumed (decreased) electric charge amount, which is found by multiplying a consumption current amount by a discharging duration.

$$SOC = \frac{Qa}{Qf} \times 100 \quad (1)$$

The meaning of the term "OCV" is intended to include an open circuit voltage. The OCV is a voltage between terminals of the auxiliary battery 24 in a state in which no subject circuit is electrified.

—Auxiliary Unit—

Figure 2:
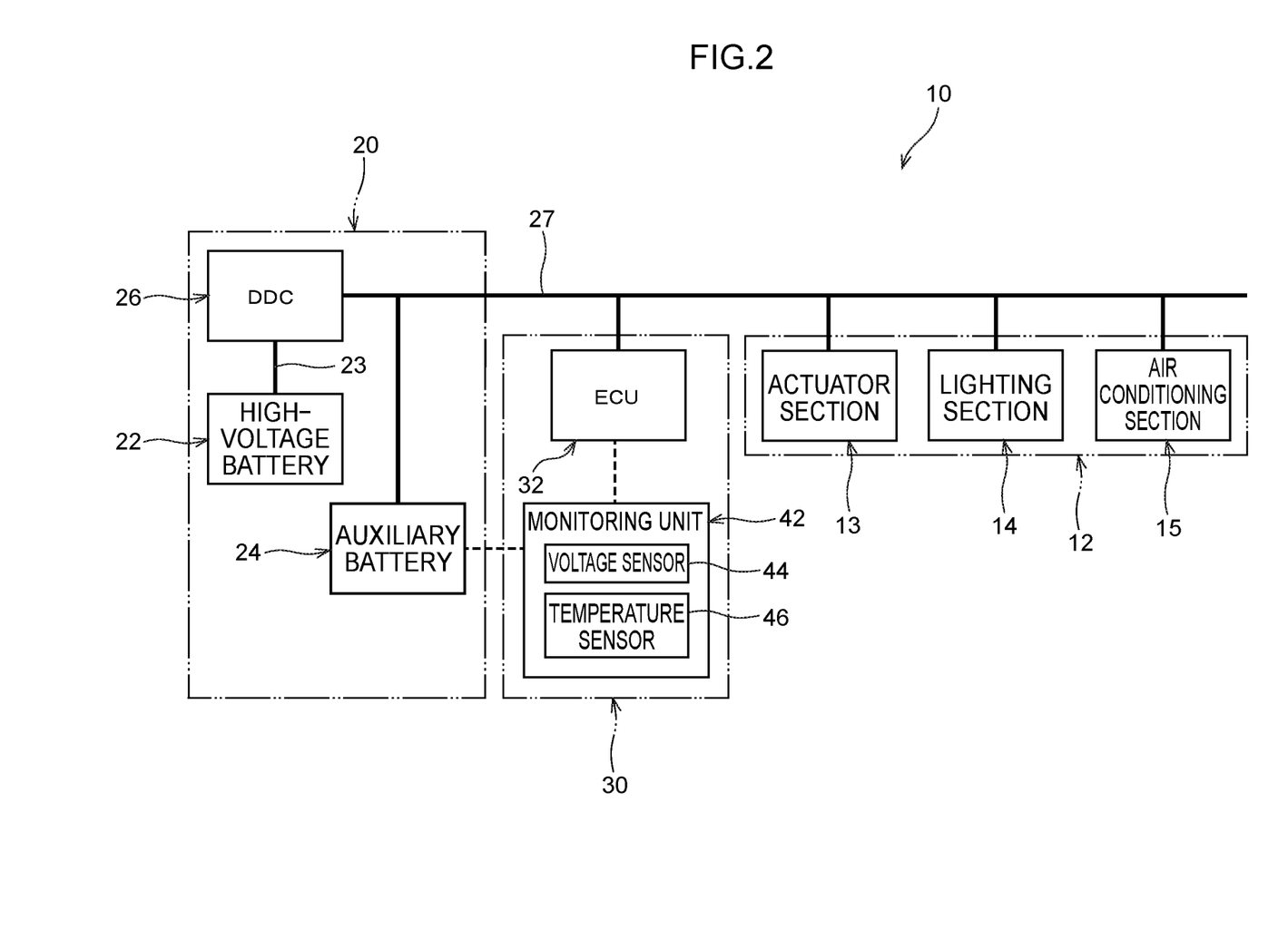
FIG. 2 is a block diagram showing specific structures of the state of charge estimation device, a power supply unit and an auxiliary unit that are shown in FIG. 1.

The auxiliary unit 12 shown in FIG. 2 includes, for example, an actuator section 13, a lighting section 14 and an air conditioning section 15, and indirectly assists running of the vehicle 10. The actuator section 13 includes motors, solenoids and the like, which are not shown in the drawings. The lighting section 14 includes lamps, internal lights and the like that are not shown in the drawings. The air conditioning section 15 features the functions of a heater and a cooler.

—Monitor—

The monitor 18 shown in FIG. 1 includes, for example, a touch panel that is not shown in the drawings. The monitor 18 is configured to display various kinds of information about the vehicle 10. Various settings of the vehicle 10 may be made at the monitor 18 by operation of the touch panel.

—Power Supply Section—

The power supply unit 20 shown in FIG. 2 includes a high-voltage battery 22, the auxiliary battery 24, which is an example of a vehicle-mounted battery, and a DDC 26. Power supplies from the power supply unit 20 are controlled by, for example, an ECU 32, which is described below.

The high-voltage battery 22 and the DDC 26 are connected via wiring 23. The DDC 26 is connected to the auxiliary unit 12, the monitor 18 (see FIG. 1) and the state of charge estimation device 30 via wiring 27. The auxiliary battery 24 is connected to the wiring 27. At the DDC 26, the voltage of electricity supplied from the high-voltage battery 22 is stepped down. The stepped-down electric power from the DDC 26 or electric power supplied from the auxiliary battery 24 is supplied to the auxiliary unit 12, the monitor 18 and the state of charge estimation device 30. Switching between the high-voltage battery 22 and the auxiliary battery 24 is implemented by switching of a relay switch that is not shown in the drawings.

—Correlation Characteristic of the Auxiliary Battery—

Figure 4:
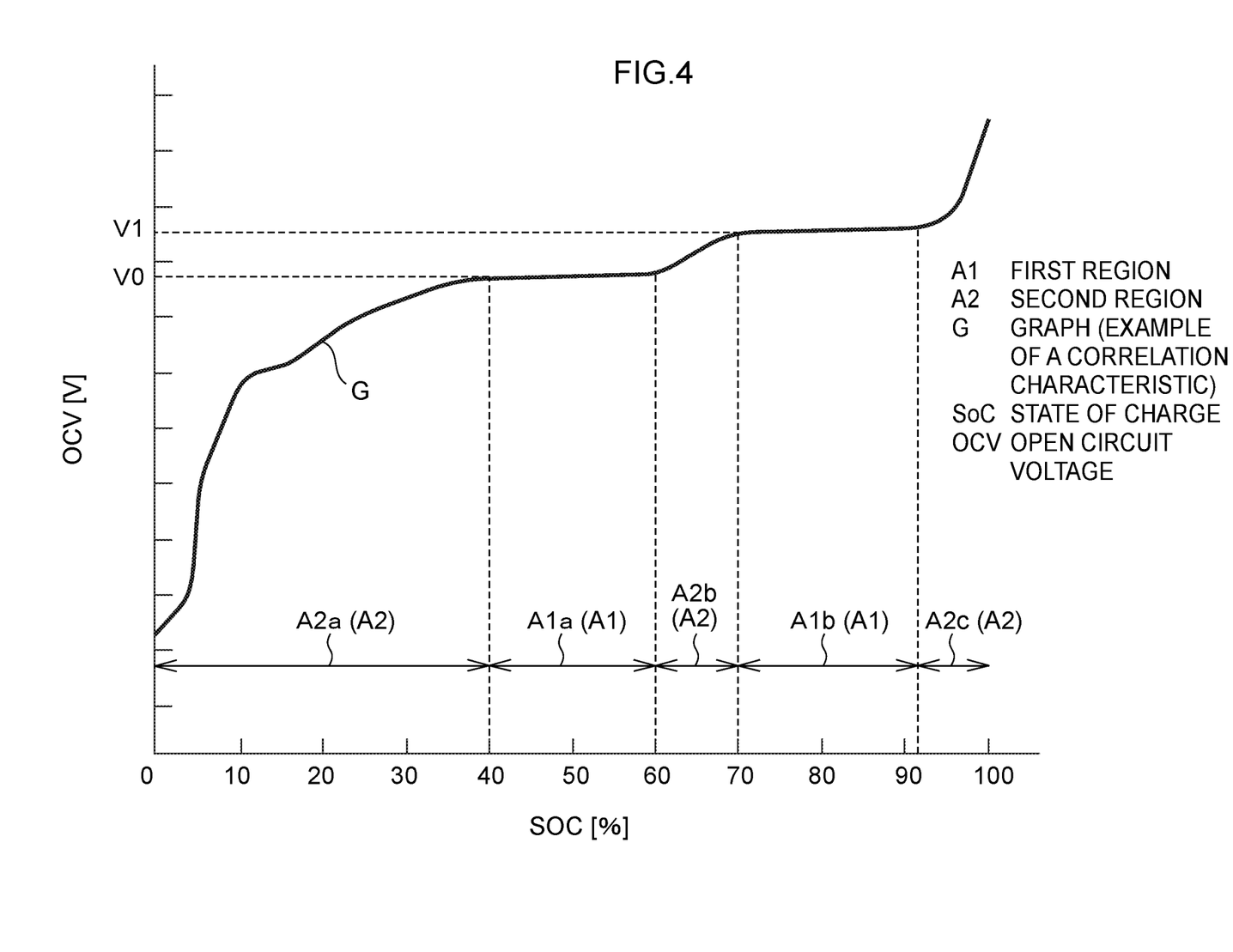
FIG. 4 is a graph showing a correlation characteristic between SoC and OCV of the power supply unit shown in FIG. 1.

FIG. 4 shows a graph G that is an example of a correlation characteristic between SoC (state of charge) and OCV (open circuit voltage) of the auxiliary battery 24 (see FIG. 2). In the graph G, the horizontal axis represents SoC (unit: %) and the vertical axis represents OCV (unit: V). The graph G includes a first region A1 and a second region A2. In the first region A1, a rate of change of the OCV with respect to the SoC (below referred to as the rate of change R) is constant. In the second region A2, the rate of change R is greater than in the first region A1. The rate of change R (unit: V/%) is not depicted in the drawing.

In the present exemplary embodiment, as an example, a region in which 0<R≤2 mV/% is specified at the ECU 32 that is described below (see FIG. 2) as being the first region A1 in which the rate of change R is constant, and a region in which R>2 mV/% is specified at the ECU 32 as being the second region A2 in which the rate of change R is larger.

The first region A1 includes, for example, a first region A1a and a first region A1b. The second region A2 includes, for example, a second region A2a, a second region A2b and a second region A2c. These occur in order of, from small SoC values to large SoC values, the second region A2a, the first region A1a, the second region A2b, the first region A1b, and the second region A2c. In the graph G, as an example, the first region A1a is a region from SoC=40% to SoC=60%, and the first region A1b is a region from SoC=70% to SoC=92%. SoC values at the boundaries of the first region A1 may differ from the present exemplary embodiment.

In the graph G, an OCV corresponding to the first region A1a is represented by V0 (V), an OCV corresponding to the first region A1b is represented by V1 (V), and V0<V1. That is, when the SoC is to be found from the OCV using the graph G, in the first region A1, a single SoC cannot be uniformly determined from a single OCV (V0 or V1). In contrast, in the second region A2, a single SoC can be uniquely determined from a single OCV.

—Configuration of Principal Elements—

Now, the state of charge estimation device 30 is described.

The state of charge estimation device 30 shown in FIG. 1 includes the ECU 32, an ignition sensor 38, a timer 39 and a monitoring unit 42. The state of charge estimation device 30 estimates a state of charge of the vehicle 10 when the vehicle is started.

—ECU—

The ECU 32 includes a CPU 33, ROM 34, RAM 35 and storage 36. The ECU 32, the ignition sensor 38, the timer 39, the monitoring unit 42, the auxiliary unit 12, the monitor 18 and the power supply unit 20 are connected via a bus 31 to be capable of communicating with one another.

The CPU 33 executes various programs including, for example, a state of charge estimation program and controls operations of respective sections of the power supply unit 20. That is, the CPU 33 reads a program from the ROM 34 or the storage 36 and executes the program using the RAM 35 as a workspace. The CPU 33 implements control of the structures described above and various kinds of computational processing and the like in accordance with programs recorded in the ROM 34 or storage 36.

The ROM 34 stores various programs and various kinds of data. The RAM 35 serves as a workspace, temporarily memorizing programs and data. The storage 36 is structured by, for example, Flash ROM. The storage 36 stores various programs, including an operating system, and various kinds of data.

—Ignition Sensor—

The ignition sensor 38 detects whether an ignition switch, which is not shown in the drawings, is in an on state or an off state. That is, the ignition sensor 38 is an example of a vehicle state detection section that detects whether the vehicle 10 is started (on) or parked (off). Information on starting and parking of the vehicle 10 detected by the ignition sensor 38 is sent to the ECU 32.

—Timer—

The timer 39 measures an elapsed time Δt (unit: hours) from a time when parking of the vehicle 10 is detected by the ignition sensor 38 to the next time starting of the vehicle 10 is detected. Information on the elapsed time Δt measured by the timer 39 is sent to the ECU 32.

—Monitoring Unit—

As shown in FIG. 2, the monitoring unit 42 includes, for example, a voltage sensor 44 and a temperature sensor 46. The voltage sensor 44 measures the OCV between the terminals of the auxiliary battery 24, which are not shown in the drawings. Information on the OCV measured by the voltage sensor 44 is sent to the ECU 32. Times at which measurements are made by the voltage sensor 44 are decided by the ECU 32. The temperature sensor 46 measures a temperature of the auxiliary battery 24. Information on the temperature measured by the temperature sensor 46 is sent to the ECU 32.

=Functional Structures=

The ECU 32 of the state of charge estimation device 30 uses the hardware resources described above to realize various functions when executing the state of charge estimation program that estimates an SoC of the auxiliary battery 24. Functional structures realized by the ECU 32 are now described. Refer to FIG. 1 and FIG. 2 for the structures described above; the individual figure numbers are not given in this description.

Figure 3:
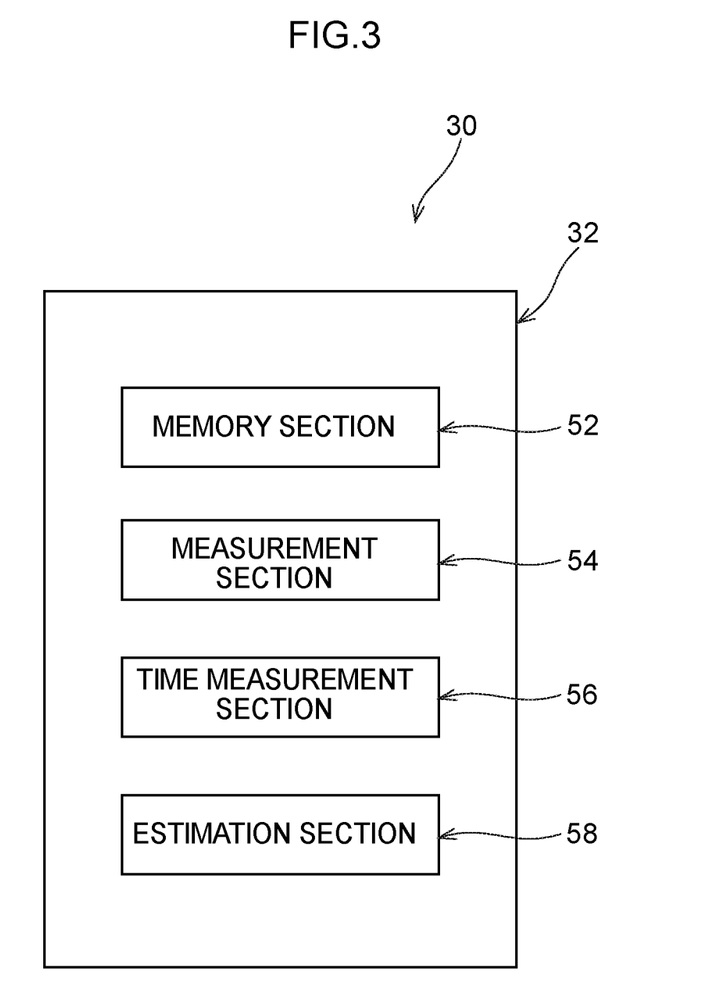
FIG. 3 is a block diagram showing an example of functional structures of the state of charge estimation device shown in FIG. 1.

As shown in FIG. 3, as functional structures, the ECU 32 includes a memory section 52, a measurement section 54, a time measurement section 56 and an estimation section 58. The functional structures are realized by the CPU 33 of the ECU 32 reading a program and information (data) memorized in the ROM 34 or storage 36 and executing the program.

—Memory Section—

The memory section 52 includes the storage 36. The memory section 52 memorizes a specified dark current I (unit: A), which is specified as a current that flows at the auxiliary battery 24 while the vehicle 10 is parked, and a first state of charge Sa (an SoC) at the most recent time the vehicle was parked before the vehicle is started. The specified dark current I and the first state of charge Sa are not shown in the drawings.

The meaning of the term "while the vehicle 10 is parked" is intended to include a period from a time when the ignition sensor 38 detects the off state (parking) until a time when the ignition sensor 38 detects the on state (starting). The meaning of the term "the most recent time the vehicle is parked before the vehicle is started" is intended to include a time during a period before starting of the vehicle 10 is detected at which a time difference between when starting is detected and when the vehicle 10 was parked is shortest. An initial value of the specified dark current I is a design value specified in advance before shipping of the vehicle 10. The specified dark current I is updated (overwritten) by the estimation section 58, which is described below.

—Measurement Section—

The measurement section 54 includes the voltage sensor 44. The measurement section 54 measures the OCV of the auxiliary battery 24 at the time the ignition sensor 38 detects the on state. That is, each time the vehicle 10 is started, the measurement section 54 measures the OCV at the time of starting. Information on the measured OCV is sent to the memory section 52.

—Time Measurement Section—

The time measurement section 56 includes the timer 39. The time measurement section 56 measures the elapsed time Δt from when the vehicle 10 is parked (represented as time ta) to when the vehicle 10 is started (a time of starting of the vehicle, represented as time tb). The elapsed time Δt (hours) is found by subtracting ta from tb. Information on the measured elapsed time Δt is sent to the memory section 52.

—Estimation Section—

The estimation section 58 is configured to calculate a second state of charge Sb and a third state of charge Sc. How the second state of charge Sb and third state of charge Sc are calculated is described below. The second state of charge Sb and third state of charge Sc are not shown in the drawings.

The second state of charge Sb is an SoC obtained on the basis of the first state of charge Sa, the specified dark current I and the elapsed time Δt. More specifically, the second stage of charge Sb is calculated using the following expression (2), in which Qf represents the fully charged charge amount of the auxiliary battery 24.

$$Sb = Sa - \frac{I \times \Delta t}{Qf} \times 100 \qquad (2)$$

The third state of charge Sc is an SoC that is obtained on the basis of the graph G (see FIG. 4) and the OCV. More specifically, an SoC that corresponds to the OCV is obtained from the graph G. The third state of charge Sc can be uniquely determined from the single OCV if the OCV is located in the second region A2 of the graph (see FIG. 4).

The estimation section 58 is configured such that, if the OCV measured by the measurement section 54 when the vehicle 10 is started has a value in the second region A2 of the graph G, the estimation section 58 updates the specified dark current I memorized in the memory section 52 so as to bring the second state of charge Sb closer to the third state of charge Sc. That is, the specified dark current I is corrected such that a difference ΔS (=Sb−Sc) approaches zero. A value of the difference ΔS converted to a current value is referred to as a correction variable Δd for correcting the specified dark current I. That is, the correction variable Δd is calculated using the following expression (3). The unit of the correction variable Δd is A.

$$\Delta d = \frac{(Sb - Sc) \times Qf}{100 \times \Delta t} \quad (3)$$

In the present exemplary embodiment, as an example, the estimation section 58 is configured to employ a correction term based on the correction variable Δd and a constant k that is specified in advance (unit: $A^{-1}$), correct the specified dark current I to a specified dark current Iz with expression (4) or expression (5), and update the specified dark current I at the memory section 52 to the new specified dark current Iz (unit: A). In the present exemplary embodiment, as an example, if an error ΔE (unit: %) obtained by expression (6) is +5% or more, expression (4) is employed, and if the error ΔE is −5% or less, expression (5) is employed. In expression (6), ΔQ1=(Sa−Sc)×Qf/100, and ΔQ2=I×Δt.

$$Iz = I - \Delta d^2 \times k \quad (4)$$

$$Iz = I + \Delta d^2 \times k \quad (5)$$

$$\Delta E = \frac{(\Delta Q2 - \Delta Q1) \times 100}{Qf} \quad (6)$$

Hence, if an OCV measured by the measurement section 54 when the vehicle is started on a subsequent occasion has a value in the first region A1, the estimation section 58 is configured to estimate a state of charge Sd of the auxiliary battery 24 on the basis of a first state of charge Sa, the specified dark current I and an elapsed time Δt. More specifically, the estimation section 58 is configured to estimate the state of charge Sd by calculating expression (2) with Sb equaling Sd.

=Operation and Effects=

Now, operation of the state of charge estimation device 30 according to the present invention is described.

Figure 7:
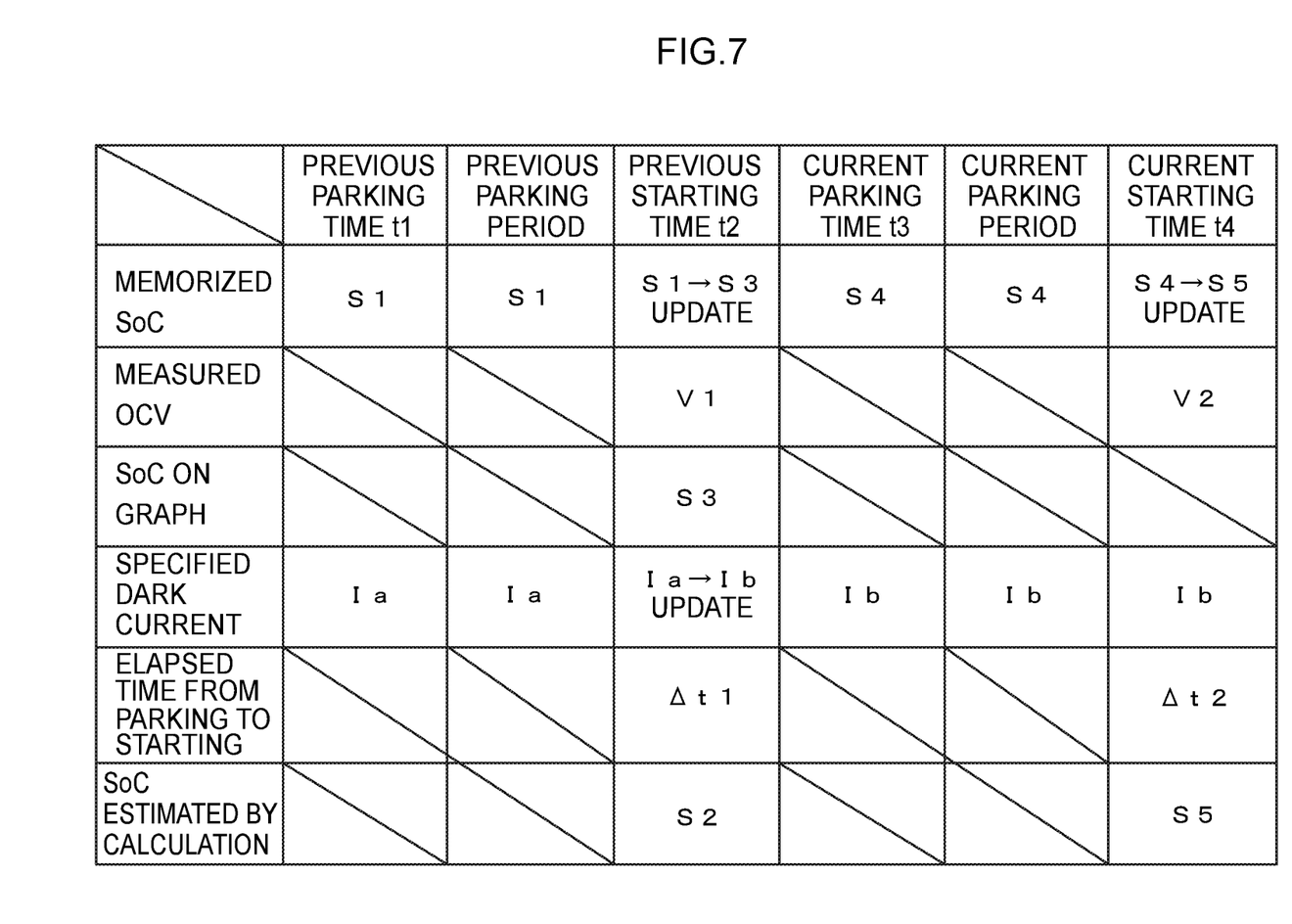
FIG. 7 is a table showing values of various parameters at times and periods from a previous time of parking to a current time of starting of a vehicle 10 shown in FIG. 1.

FIG. 7 shows a summary of values of various parameters at various times and periods: a previous parking time t1 of the vehicle 10 (see FIG. 1), a previous parking period, a previous starting time t2, a current parking time t3, a current parking duration, and a current starting time t4. The parameters are, for example, a memorized SoC, a measured OCV, an SoC on the graph, the specified dark current, an elapsed time from parking to starting, and an SoC estimated by calculation.

The meaning of the term "memorized SoC" is intended to include an SoC memorized at the memory section 52 (see FIG. 3). The memorized SoC is represented by, for example, S1, S3, S4 and S5 (%). The meaning of the term "measured OCV" is intended to include an OCV measured by the measurement section 54 (see FIG. 3). The measured OCV is represented by, for example, a voltage V1 at the previous starting time t2 and a voltage V2 at the current starting time t4. The meaning of the term "SoC on the graph" is intended to include an SoC found (derived) from the graph G (see FIG. 4) and the OCV. The SoC on the graph is represented by, for example, S3 (%) at the previous starting time t2.

The meaning of the term "specified dark current" is intended to include a dark current of the auxiliary battery 24 (see FIG. 1) memorized (specified) at the memory section 52. The specified dark current is represented by, for example Ia and Ib (A). The specified dark current is updated from the specified dark current Ia to the specified dark current Ib at the previous starting time t2. The elapsed time from the previous parking time t1 to the previous starting time t2 is Δt1 (hours), and the elapsed time from the current parking time t3 to the current starting time t4 is Δt2 (hours). The meaning of the term "SoC estimated by calculation" is intended to include an SoC estimated by calculation using expression (2) described above. The SoC estimated at the previous starting time t2 is S2 (%) and the SoC estimated at the current starting time t4 is S5 (%).

Figure 8:
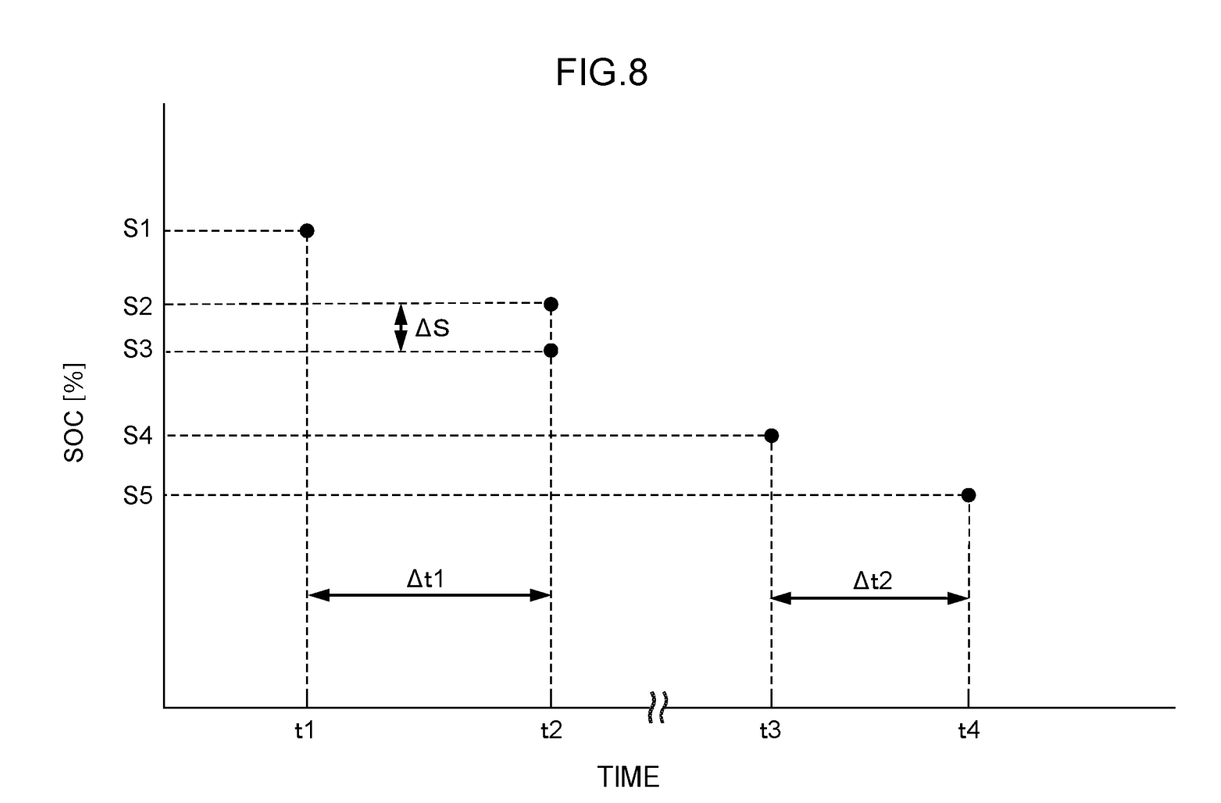
FIG. 8 is a graph showing the SoC at the various times shown in FIG. 7.

FIG. 8 shows the SoCs (S1, S2, S3, S4 and S5) at the times from the previous parking time t1 to the current starting time t4. The values S1, S2, S3, S4 and S5 shown in FIG. 8 are examples; magnitude relationships therebetween may differ from the present exemplary embodiment.

As shown in FIG. 7, the state of charge estimation device 30 (see FIG. 2) employs the various parameters obtained between the previous parking time t1 and the previous starting time t2 to update the specified dark current from Ia to Ib at the previous starting time t2. Hence, the state of charge estimation device 30 employs the updated specified dark current Ib to estimate the SoC at the current starting time t4 (S5). The measured OCV at the previous starting time t2 has a value (V1) in the second region A2 (see FIG. 4), and the measured OCV at the current starting time t4 has a value (V2) in the first region A1 (see FIG. 4).

Now, specific operations of the state of charge estimation device 30 are described. For structures of the vehicle 10 and the state of charge estimation device 30, refer to FIG. 1 and FIG. 2; the individual figure numbers are not given in this description. For the graph G, refer to FIG. 4. For the various parameters at respective times, refer to FIG. 7 and FIG. 8.

Figure 5:
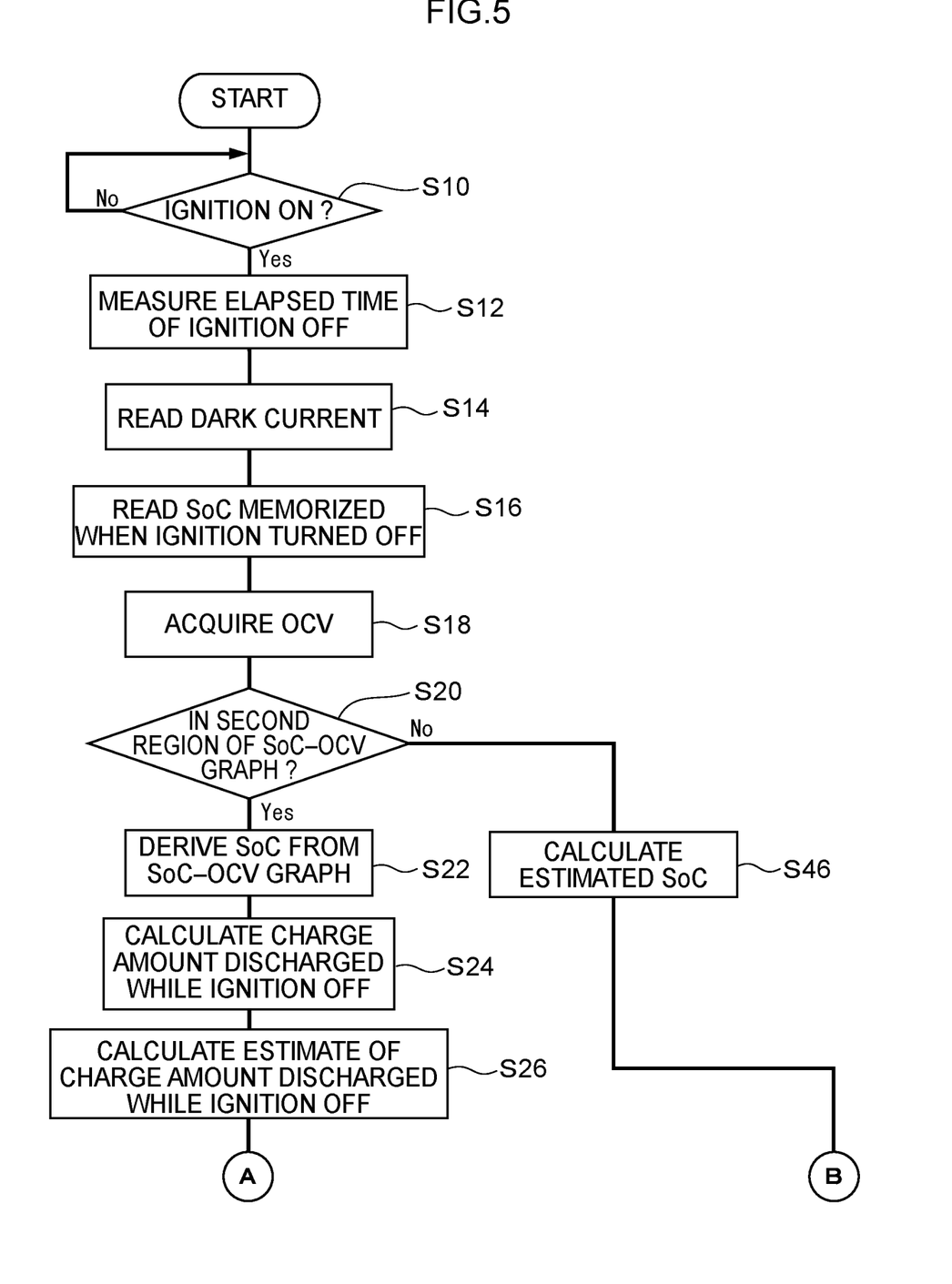
FIG. 5 is a flowchart showing a flow of a first half of SoC estimation processing using the state of charge estimation device shown in FIG. 1.
Figure 6:
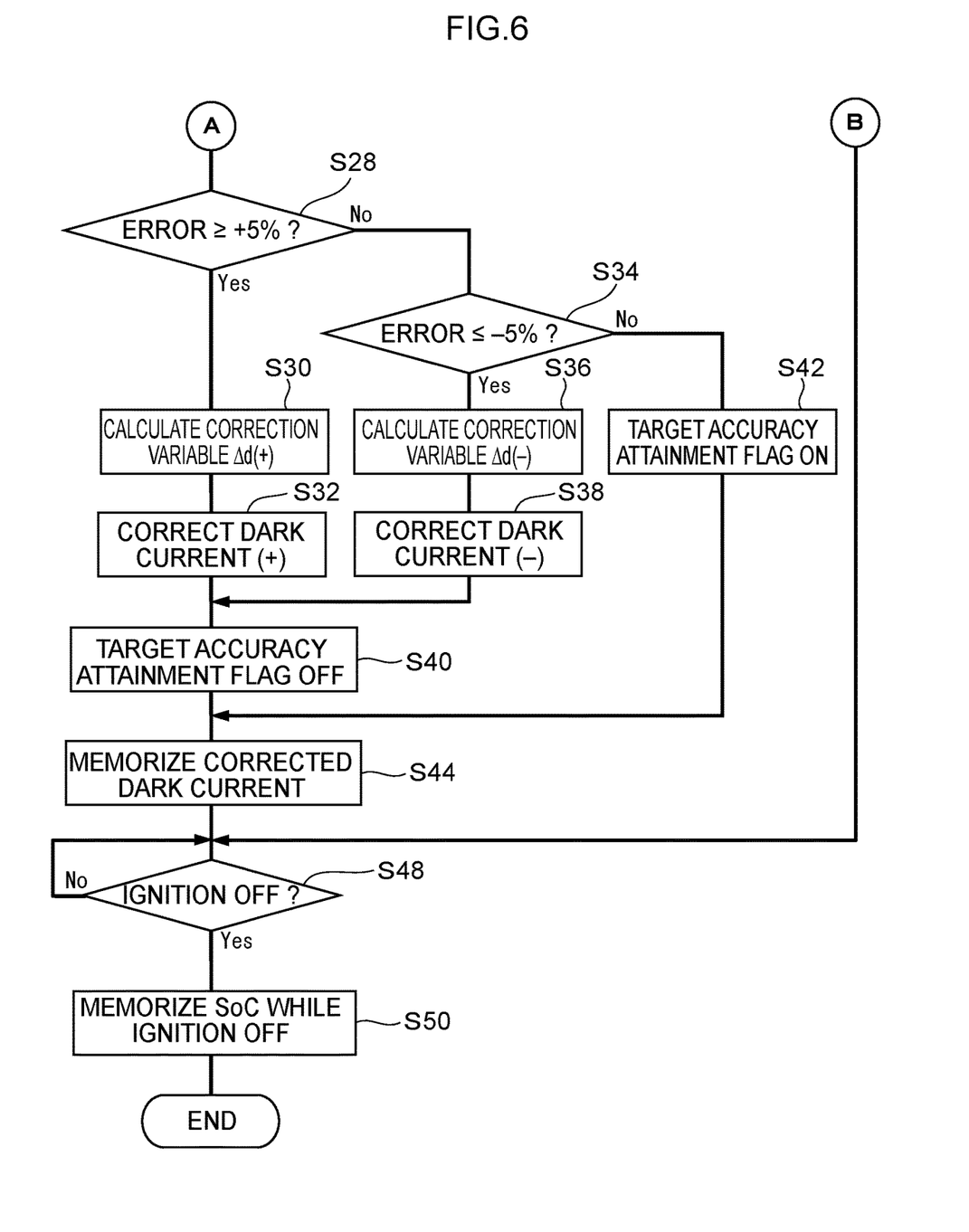
FIG. 6 is a flowchart showing a flow of a second half of the SoC estimation processing using the state of charge estimation device shown in FIG. 1.

FIG. 5 and FIG. 6 are a flowchart showing a flow of state of charge estimation processing by the ECU 32. FIG. 5 shows a first half of the flowchart, and FIG. 6 shows a second half of the flowchart. The ECU 32 implements the state of charge estimation processing for the auxiliary battery 24 by the CPU 33 reading the state of charge estimation processing program from the ROM 34 or storage 36, loading the program into the RAM 35 and executing the program.

In step S10, the CPU 33 makes a determination as to whether the ignition sensor 38 detects the on state or the off state. If the ignition sensor 38 detects the on state ("Yes" in step S10), the CPU 33 proceeds to step S12. If the ignition sensor 38 detects the off state ("No" in step S10), the CPU 33 repeats step S10.

In step S12, the timer 39 measures the elapsed time Δt from the ignition sensor detecting the off state to the ignition sensor detecting the on state. Information on the elapsed time Δt is acquired by the CPU 33. The value of Δt at this time is represented by Δt1. Then the CPU 33 proceeds to step S14.

In step S14, the CPU 33 reads the specified dark current I memorized at the memory section 52. The specified dark current I at this time is the specified dark current Ia. Then the CPU 33 proceeds to step S16.

In step S16, the CPU 33 reads from the memory section 52 the SoC (S1) of time t1 at which the ignition sensor 38 detected the off state (the most recent time the vehicle 10 was parked before the vehicle 10 is started). The state of charge S1 corresponds to the first state of charge Sa. Then the CPU 33 proceeds to step S18.

In step S18, the CPU 33 acquires an OCV (V1) measured by the measurement section 54. The OCV may be acquired from the measurement section 54 directly, or may be acquired from the memory section 52. Then the CPU 33 proceeds to step S20.

In step S20, the CPU 33 makes a determination as to whether the OCV (V1) has a value in the second region A2 of the graph G. If the OCV has a value in the second region A2 ("Yes" in step S20), the CPU 33 proceeds to step S22. If the OCV has a value in the first region A1 ("No" in step S20), the CPU 33 proceeds to step S46.

In step S22, the CPU 33 derives an SoC (S3) from the OCV (V1) and the graph G. The state of charge S3 corresponds to the third state of charge Sc. The derived value of the SoC is memorized at the memory section 52. Then the CPU 33 proceeds to step S24.

In step S24, the CPU 33 employs expression (2) to calculate the state of charge S2, with Sa=S1, SB=S2, I=Ia, and Δt=Δt1. The state of charge S2 corresponds to the second state of charge Sb. The CPU 33 also calculates a discharged charge amount ΔQ1 (Ah) of the auxiliary battery 24 during the period of the elapsed time Δt1. More specifically, the CPU 33 calculates ΔQ1 using the arithmetic expression ΔQ1=(S2−S3)×Qf/100. Then the CPU 33 proceeds to step S26.

In step S26, the CPU 33 calculates an estimated discharged charge amount ΔQ2 (Ah) during the period of the elapsed time Δt1. More specifically, the CPU 33 calculates ΔQ2 using the arithmetic expression ΔQ2=Ia×Δt1. Then the CPU 33 proceeds to step S28.

In step S28, the CPU 33 calculates the error ΔE (%) using ΔQ1, ΔQ2 and expression (6) described above, and the CPU 33 makes a determination as to whether the error ΔE is at least +5%. If the error ΔE is +5% or more ("Yes" in step S28), the CPU 33 proceeds to step S30. If the error ΔE is less than +5% ("No" in step S28), the CPU 33 proceeds to step S34.

In step S30, the CPU 33 employs expression (3) to calculate the correction variable Δd, with Sb=S2, Sc=S3 and Δt=Δt1. This correction variable Δd is identified as correction variable Δd(+). Then the CPU 33 proceeds to step S32.

In step S32, the CPU 33 employs expression (4) to calculate the specified dark current Ib, with Δd=Δd(+), I=Ia, and Iz=Ib. That is, the CPU 33 corrects the specified dark current Ia to the specified dark current Ib. Then the CPU 33 proceeds to step S40.

In step S34, the CPU 33 makes a determination as to whether the error ΔE is at most −5%. If the error ΔE is −5% or less ("Yes" in step S34), the CPU 33 proceeds to step S36. If the error ΔE is greater than −5% ("No" in step S34), the CPU 33 proceeds to step S42. That is, if −5%<ΔE<+5%, the CPU 33 proceeds to step S42.

In step S36, the CPU 33 employs expression (3) to calculate the correction variable Δd, with Sb=S2, Sc=S3 and Δt=Δt1. This correction variable Δd is identified as correction variable Δd(−). Then the CPU 33 proceeds to step S38.

In step S38, the CPU 33 employs expression (5) to calculate the specified dark current Ib, with Δd=Δd(−), I=Ia, and Iz=Ib. That is, the CPU 33 corrects the specified dark current Ia to the specified dark current Ib. Then the CPU 33 proceeds to step S40.

In step S40, the CPU 33 judges that the error ΔE is not within a target range (a range of absolute values smaller than 5%), and sets a target accuracy attainment flag to "off". Information that the target accuracy attainment flag is set to off is memorized at the memory section 52. Then the CPU 33 proceeds to step S44.

In step S42, the CPU 33 determines that the error ΔE is within the target range (the range of absolute values smaller than 5%), and sets the target accuracy attainment flag to "on". Information that the target accuracy attainment flag is set to on is memorized at the memory section 52. Then the CPU 33 proceeds to step S44.

In step S44, the CPU 33 memorizes the specified dark current Ib that has been obtained at the memory section 52. That is, the CPU 33 updates the specified dark current Ia to the specified dark current Ib (A). Then the CPU 33 proceeds to step S48.

In step S46, the CPU 33 employs expression (2) to calculate the state of charge S5 to be the estimated SoC, with Sa=S4 (%), Δt=Δt2 (hours), Sb=S5 (%) and I=Ib. Then the CPU 33 proceeds to step S48.

In step S48, the CPU 33 makes a determination as to whether the ignition sensor 38 detects the on state or the off state. If the ignition sensor 38 detects the on state ("Yes" in step S48), the CPU 33 proceeds to step S50. If the ignition sensor 38 detects the off state ("No" in step S48), the CPU 33 repeats step S48.

In step S50, the CPU 33 memorizes the obtained state of charge S5 at the memory section 52. Then the program ends.

As described above, the auxiliary battery 24 for which the state of charge (Soc) is estimated by the state of charge estimation device 30 features, in the graph G of SoC and OCV, the first region A1 and the second region A2. If an OCV when the vehicle is started has a value in the second region A2, the estimation section 58 updates the specified dark current I memorized at the memory section 52 so as to bring the second state of charge Sb closer to the third state of charge Sc. That is, the specified dark current I is corrected on the basis of the second region A2 of the correlation characteristic in which a state of charge may be uniquely determined from an OCV.

Hence, if an OCV has a value in the first region A1 when the vehicle is started on a subsequent occasion, the estimation section 58 estimates the state of charge of the auxiliary battery 24 on the basis of the first state of charge Sa, the updated (corrected) specified dark current I, and the elapsed time Δt. Thus, the specified dark current I is corrected on the basis of the correlation characteristic in the second region A2, and when an OCV has a value in the first region A1, the state of current of the auxiliary battery 24 is estimated using the corrected specified dark current I. Therefore, electricity from the auxiliary battery 24 may not be consumed in measurements of discharge currents and current measurement errors may not be introduced. As a result, accuracy of estimation of the state of charge of the auxiliary battery 24 when the vehicle is started after a period of parking may be raised.

In the state of charge estimation device 30, although a correction amount per correction cycle is smaller than in a situation in which the specified dark current I is corrected at one time using only the correction variable Δd, variations in correction amounts when correction is applied over plural cycles may be kept small. For example, if Δd is in the order (order of magnitude) of milliamps, a correction amount when $Δd^2$ is multiplied by the constant k and subtracted from the specified dark current I is smaller than a correction amount in a situation in which Δd is subtracted from the specified dark current I. That is, because the specified dark current I is progressively corrected when correction is applied over plural cycles, variations in the estimated states of charge may be suppressed.

—Variant Examples—

The present disclosure is not limited by the exemplary embodiment described above. Variant examples are described below. Structures that are basically the same as structures in the exemplary embodiment described above are assigned the same reference symbols and are not described here.

The state of charge estimation device 30 may include a reception section that receives various kinds of information as an individual structural unit. The state of charge estimation device 30 is not limited to using a correction term based on the constant k and the correction variable Δd to correct the specified dark current I; the specified dark current I may be corrected using the arithmetic expression Iz=I−Δd. That is, the specified dark current I may be found such that ΔS=0.

A table of correction coefficients corresponding to temperatures measured by the temperature sensor 46 may be specified in the memory section 52 in advance, and the various parameters mentioned above may be corrected using these correction coefficients.

The step of setting the target accuracy attainment flag to off in step S40 and the step of setting the target accuracy attainment flag to on in step S42 may be omitted.

The target accuracy range for the error ΔE is not limited to the range of absolute values between 0% and 5%. That is, the boundary value of the target accuracy range of the error ΔE is not limited to 5% but may be an alternative value.

SoCs obtained using the graph G and SoCs obtained by estimation may be displayed at the monitor 18. That is, the monitor 18 may be used as a reporting section that reports SoC conditions to occupants of the vehicle 10. Alternative examples of the reporting section include using a speaker to give reports by voice.

In the graph of the correlation characteristic of SoC and OCV, the first region A1 may be a single region or three or more regions, and the second region A2 may be one region, two regions, or four or more regions.

The boundary value of the rate of change R may be set to a value other than 2 mV/%.

If the auxiliary battery 24 is replaced while the vehicle is parked, and the SoC is in a fully charged state, new corrections may be applied from a subsequent period of parking.

The state of charge estimation processing that, in the exemplary embodiment described above, is executed by the CPU 33 reading software (a program) may be executed by various kinds of processor other than the CPU 33. Examples of processors in these cases include a PLD (programmable logic device) in which a circuit configuration can be modified after manufacturing, such as an FPGA (field programmable gate array) or the like, a dedicated electronic circuit which is a processor with a circuit configuration that is specially designed to execute specific processing, such as an ASIC (application-specific integrated circuit) or the like, and so forth. The state of charge estimation processing may be executed by one of these various kinds of processors, and may be executed by a combination of two or more processors of the same or different kinds (for example, plural FPGAs, a combination of a CPU with an FPGA, or the like). Hardware structures of these various kinds of processors are, to be more specific, electronic circuits combining circuit components such as semiconductor components and the like.

In the exemplary embodiment described above, a mode is described in which the state of charge estimation program is memorized in advance (installed) at the ROM 34 or the storage 36, but this is not limiting. The program may be provided in a mode recorded on a recording medium, such as a CD-ROM (compact disc read-only memory), DVD-ROM (digital versatile disc read-only memory), USB (universal serial bus) memory or the like. Modes are also possible in which the state of charge estimation program is downloaded from external equipment via a network.

What is claimed is:

1. A state of charge estimation device for estimating a state of charge of a vehicle-mounted battery when the vehicle is started, a correlation characteristic between state of charge and open circuit voltage of the vehicle-mounted battery including a first region in which a rate of change of the open circuit voltage with respect to the state of charge is constant and a second region in which the rate of change is greater than in the first region, and the state of charge estimation device comprising:

a memory section that memorizes a specified dark current, which is specified as a current that flows at the vehicle-mounted battery while the vehicle is parked, and a first state of charge at a most recent time the vehicle is parked before the vehicle is started;

a measurement section that measures the open circuit voltage;

a time measurement section that measures an elapsed time from when the vehicle is parked to when the vehicle is started; and an estimation section that, when the open circuit voltage measured by the measurement section when the vehicle is started has a value in the second region, updates the specified dark current memorized at the memory section such that a second state of charge obtained on the basis of the first state of charge, the specified dark current and the elapsed time approaches a third state of charge obtained on the basis of the correlation characteristic and the open circuit voltage, and when the open circuit voltage measured by the measurement section when the vehicle is started on a subsequent occasion has a value in the first region, estimates a state of charge of the vehicle-mounted battery on the basis of the first state of charge, the specified dark current and the elapsed time.

2. The state of charge estimation device according to claim 1, wherein the estimation section employs a correction term $Δd^2 \times k$ for correcting the specified dark current, Δd representing a correction variable that is obtained on the basis of a difference between the third state of charge and the second state of charge, and k representing a constant.

3. The state of charge estimation device according to claim 1, wherein the estimation section employs an arithmetic expression Iz=I−Δd for correcting the specified dark current, Δd representing a correction variable that is obtained on the basis of a difference between the third state of charge and the second state of charge, and I representing the specified dark current.

4. The state of charge estimation device according to claim 1, wherein the estimation section employs a table of correction coefficients corresponding to temperatures measured by a temperature sensor for correcting the specified dark current, the table being memorized at the memory section in advance.

5. The state of charge estimation device according to claim 1, wherein the first region is a single region or at least three regions.

6. The state of charge estimation device according to claim 1, wherein the second region is a single region, two regions or at least four regions.

* * * * *